US012727472B2

(12) United States Patent
Dutta et al.

(10) Patent No.: US 12,727,472 B2
(45) Date of Patent: Sep. 1, 2026

(54) TAPERED ANTIFUSE

(71) Applicant: INTERNATIONAL BUSINESS MACHINES CORPORATION, Armonk, NY (US)

(72) Inventors: Ashim Dutta, Clifton Park, NY (US); Chih-Chao Yang, Glenmont, NY (US); Shravana Kumar Katakam, Lehi, UT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 385 days.

(21) Appl. No.: 18/468,758

(22) Filed: Sep. 18, 2023

(65) Prior Publication Data

US 2025/0096123 A1 Mar. 20, 2025

(51) Int. Cl.
*H10W 20/49* (2026.01)

(52) U.S. Cl.
CPC ................................ *H10W 20/491* (2026.01)

(58) Field of Classification Search
CPC . H01L 23/5252; H01L 23/5256; H10B 20/25; H10B 20/20; G11C 17/165; G11C 29/787; H10W 20/491; H10W 20/493
See application file for complete search history.

(56) References Cited

U.S. PATENT DOCUMENTS

| | | | | |
|---|---|---|---|---|
| 5,587,613 | A | 12/1996 | Iranmanesh | |
| 5,789,795 | A | 8/1998 | Sanchez | |
| 6,051,851 | A | 4/2000 | Ohmi | |
| 6,124,194 | A | 9/2000 | Shao | |
| 6,251,710 | B1 | 6/2001 | Radens | |
| 6,335,228 | B1 | 1/2002 | Fuller | |
| 9,343,404 | B2 | 5/2016 | Lee | |
| 10,418,418 | B2 | 9/2019 | Murakami | |
| 10,957,701 | B1 * | 3/2021 | Shen | H01L 23/528 |
| 11,024,577 | B1 * | 6/2021 | Park | H01L 23/5252 |
| 11,239,160 | B2 | 2/2022 | Zhou | |
| 12,389,592 | B2 * | 8/2025 | Chang | H01L 21/283 |
| 2013/0168674 | A1 * | 7/2013 | Franzon | H01L 23/481 257/529 |
| 2022/0077057 | A1 | 3/2022 | Chiu | |

* cited by examiner

*Primary Examiner* — Yara B Green
*Assistant Examiner* — Benjamin Michael Kupp
(74) *Attorney, Agent, or Firm* — Jeffrey Kelly

(57) ABSTRACT

A antifuse structure including a first metal sidewall spacer and a second metal sidewall spacer arranged on opposite sides of a tapered dielectric pedestal, and a fuse dielectric on top of the tapered dielectric pedestal and between the first metal sidewall spacer and the second metal sidewall spacer.

17 Claims, 6 Drawing Sheets

SECTION A

SECTION A-A

SECTION A-A

TAPERED ANTIFUSE

BACKGROUND

The present invention generally relates to semiconductor structures, and more particularly to a tapered antifuse structure.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL generally includes gate and source/drain contacts. Layers of interconnections are formed above these logical and functional layers during the BEOL processing to complete the integrated circuit structure. As such, BEOL processing generally involves the formation of insulators and conductive wiring. The industry has typically used copper as the conductive metal for the interconnect structures most often using a dual damascene process to form a metal line/via interconnect structure.

A fuse is a structure that is normally "on" meaning that current is flowing, but once "programmed" it is "off" meaning that current does not flow. In a fuse, programming means applying a suitable voltage so that the fuse "blows" to create an open circuit or high resistance state. An antifuse is a structure that is normally "off" meaning that no current flows, but once "programmed" it is "on" meaning that current does flow. In an antifuse, programming means applying a suitable voltage to two electrodes and forming a conductive link between them to close the circuit.

In integrated circuitry memory devices, fuses and antifuses can be used for activating redundancy in memory chips and for programming functions and codes in logic chips. Specifically, dynamic random access memory (DRAM) and static random access memory (SRAM) may use fuses and antifuses for such purposes. In addition, fuses and antifuses can also be used to prevent decreased chip yield caused by random defects generated in the manufacturing process. Moreover, fuses and anti-fuses provide for future customization of a standardized chip design. For example, fuses and anti-fuses may provide for a variety of voltage options, packaging pin out options, or any other options desired by the manufacturer to be employed prior to the final processing. These customization possibilities make it easier to use one basic design for several different end products and help increase chip yield.

SUMMARY

According to an embodiment of the present invention, a tapered antifuse structure is provided. The tapered antifuse structure may include a first metal sidewall spacer and a second metal sidewall spacer arranged on opposite sides of a tapered dielectric pedestal, a fuse dielectric on top of the tapered dielectric pedestal and between the first metal sidewall spacer and the second metal sidewall spacer.

According to another embodiment of the present invention, a tapered antifuse structure is provided. The tapered antifuse structure may include a first metal sidewall spacer and a second metal sidewall spacer arranged on opposite sides of a tapered pedestal, a fuse dielectric on top of the tapered pedestal and between the first metal sidewall spacer and the second metal sidewall spacer, a first conductive line below and in direct contact with the first metal sidewall spacer, and a second conductive line below and in direct contact with the second metal sidewall spacer.

According to another embodiment of the present invention, a tapered antifuse structure is provided. The tapered antifuse structure may include a first pair of metal sidewall spacers arranged on opposite sides of a first tapered pedestal, a first fuse dielectric on top of the first tapered pedestal and between the first pair of metal sidewall spacers, a second pair of metal sidewall spacers arranged on opposite sides of a second tapered pedestal, and a second fuse dielectric on top of the second tapered pedestal and between the second pair of metal sidewall spacers, wherein a breakdown voltage of the first fuse dielectric is different than a breakdown voltage of the second fuse dielectric.

BRIEF DESCRIPTION OF THE DRAWINGS

The following detailed description, given by way of example and not intended to limit the invention solely thereto, will best be appreciated in conjunction with the accompanying drawings, in which.

Figure 1:
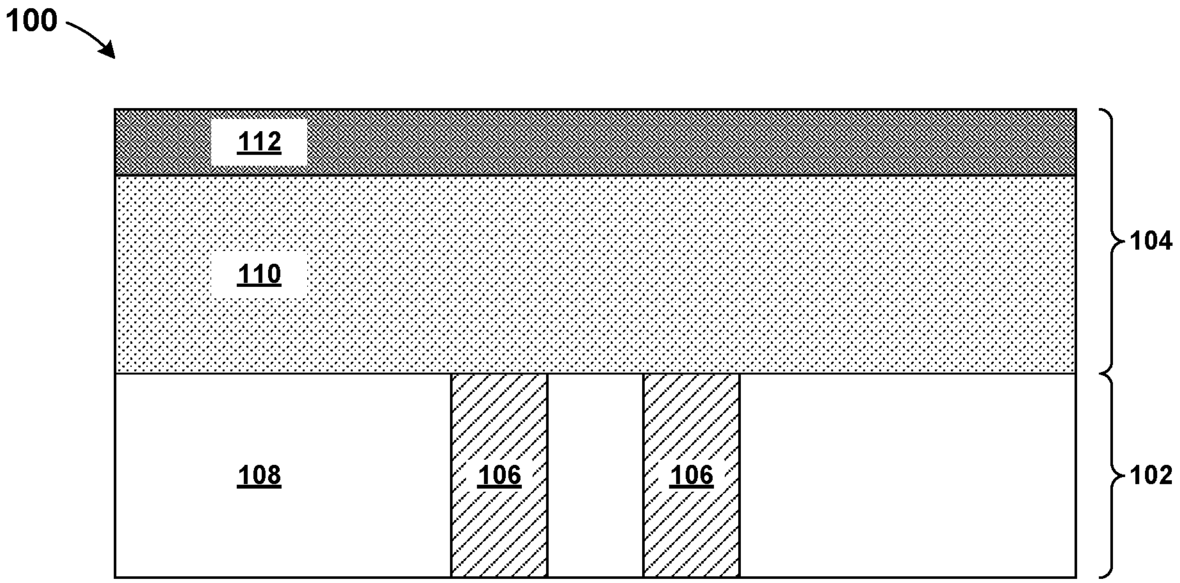
FIG. 1 illustrates a cross-sectional view of the semiconductor structure during an intermediate step of a method of fabricating an interconnect structure according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Antifuses become difficult to fabricate when interconnect dimensions scale down. Some antifuse structures can be fabricated by placing metal islands between metal wires embedded in a dielectric material. Other antifuse structures can be fabricated by placing a relatively high resistance metal between metal wires. Such antifuse structures are difficult to fabricate as the spacing between the metal wires becomes sub-15 nm. Additionally, antifuses are typically relatively bulky and take up a valuable space in an integrated circuit design. Further, bulky antifuse structures reduce the amount of available space for more important interconnect structures, for example, metal wires, and other circuit components in the circuit.

The present invention generally relates to semiconductor structures, and more particularly to a tapered antifuse structure. More specifically, the tapered antifuse structures disclosed herein include two metal sidewall spacers embedded in a dielectric layer above and contacting two metal lines and programming the antifuse structure forms an electrical connection between the two metal sidewall spacers. Exemplary embodiments of tapered antifuse structures are described in detail below by referring to the accompanying drawings in FIGS. 1 to 11. Those skilled in the art will readily appreciate that the detailed description given herein with respect to these figures is for explanatory purposes as the invention extends beyond these limited embodiments.

Referring now to FIG. 1 a demonstrative illustration of a structure 100 is shown during an intermediate step of a method of fabricating an antifuse structure according to an embodiment of the invention.

The structure 100 may include back-end-of-line metallization levels, and more specifically, a metal level 102 and a via level 104. According to at least one embodiment, the via level 104 is above the metal level 102, as illustrated. Although the metallization levels disclosed herein would typically be part of the back-end-of-line, embodiments of the present invention explicitly contemplate other locations and arrangements, such as, for example, middle-of-line, wafer backside, wafer frontside, or other known metallization regions. In all cases, the tapered antifuse structures described herein, and represented by the structure 100, will be integral to the electrical wiring system of a final device or package.

According to at least one embodiment, the metal level 102 is a typical back-end-of-line level and includes a network of conductive lines 106 embedded in a first dielectric layer 108. The conductive lines 106 form the "wiring" or electrical connections to underlying transistors and devices (not shown). The conductive lines 106 may alternatively be referred to as metal lines, traces, or metal traces.

According to embodiments of the present invention, the first dielectric layer 108 may be provided according to known techniques. The first dielectric layer 108 may be made from suitable interlevel dielectric material such as silicon based low-k dielectrics, or porous dielectrics. For example, the first dielectric layer 108 may be made from organic polymer low-k dielectrics and SiCOH-based low-k dielectrics (such as SiCOH, SiCNOH) including selective low-k dielectric deposition.

In an embodiment, the first dielectric layer 108 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering. In some embodiments, a planarization technique such as, for example, chemical mechanical planarization (CMP) and/or grinding is applied after deposition to remove excess material according to known techniques. In other embodiments, no polishing or griding of the first dielectric layer 108 is performed.

According to embodiments of the present invention, the conductive lines 106 may be provided according to known techniques. The conductive lines 106 may include any suitable conductive interconnect materials such as molybdenum, tungsten, rhodium, iridium, copper, or alloys or combinations thereof. In an embodiment, the conductive lines 106 can be formed using conventional damascene techniques in which trenches are formed in the first dielectric layer 108 and subsequently filled with the chosen conductive material. Alternatively, the conductive lines 106 can be subtractivly formed prior to deposition of the first dielectric layer 108.

Like the metal level 102, according to at least one embodiment, the via level 104 is also a typical back-end-of-line level and includes a network of conductive vias, not yet formed, embedded in a second dielectric layer 110. The conductive vias, like the conductive lines 106, also form the "wiring" or electrical connections to underlying transistors and devices. For purposes of the present description, the second dielectric layer 110 is the same, or substantially similar, as the first dielectric layer 108 previously described. In an alternate embodiment, the second dielectric layer 110 is a different material than the first dielectric layer 108.

At this stage of fabrication, the via level 104 further includes a masking layer 112 formed directly on top of the second dielectric layer 110 according to known techniques. In some embodiments, the masking layer 112 may include an oxide such as silicon oxide (SiO), a nitride such as silicon nitride (SiN), an oxynitride such as silicon oxynitride (SiON), combinations thereof, etc. In some embodiments, the masking layer 112 is a silicon nitride such as $Si_3N_4$.

According to embodiments of the present invention, a cumulative height, or thickness, of both the second dielectric layer 110 and the masking layer 112 equal a height, or thickness, of the via level 104. Furthermore, the height of the via level 104 is equal to a heigh of any conventional via level. For example, the via level 104 can range from approximately 20 nm to approximately 150 nm; however, other thicknesses are explicitly contemplated. Additionally, according to at least one embodiment, the relative height of the masking layer 112 is approximately 30% of the total height of the via level 104. According to at least another embodiment, the relative height of the masking layer 112 ranges from approximately 10% to approximately 20% of the total height of the via level 104. In all cases, the relative height of the masking layer 112 is at least 5% of the total height of the via level 104 in order to provide the necessary fuse function as is described in more detail below.

Figure 2:
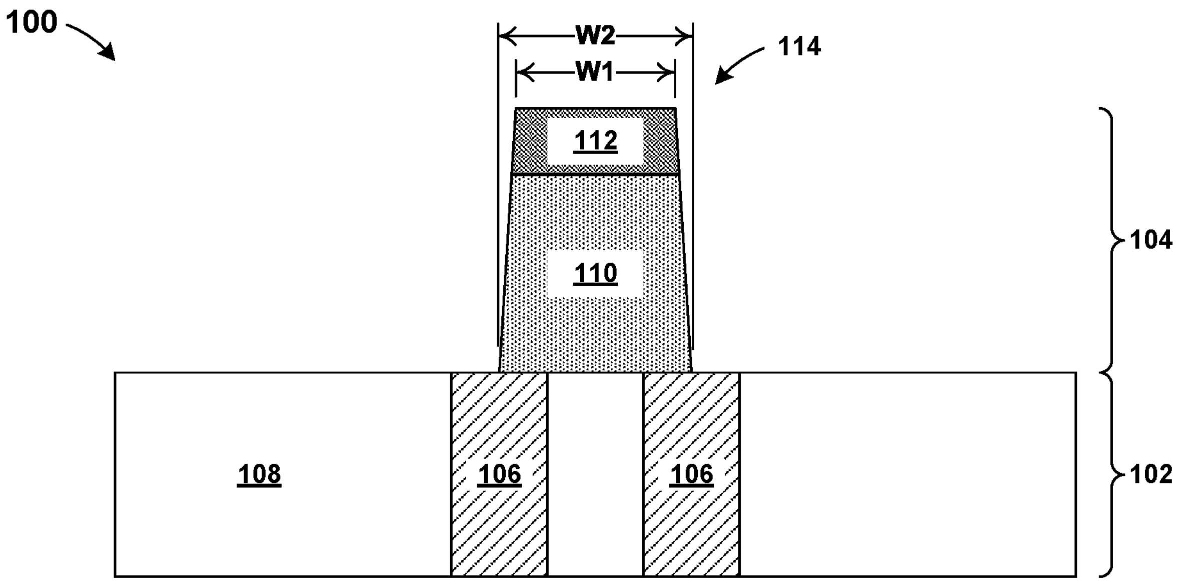
FIG. 2 illustrates a cross-sectional view of the semiconductor structure after removing portions of the via level according to an exemplary embodiment.

Referring now to FIG. 2, the structure 100 is shown after removing portions of the via level 104 in accordance with an embodiment of the present invention.

An etching technique is applied to generally remove portions of the via level 104 according to known techniques. Specifically, a suitable directional etching technique is used to etch exposed portions of the via level 104 and expose topmost surfaces of the first dielectric layer 108 and the conductive lines 106. In all cases, it is critical that topmost surfaces of the conductive lines 106 are exposed during etching. Doing so is critical to the function of the tapered antifuse structures disclosed herein, and which is described in greater detail below.

The object of this directional etching technique is to form a pedestal 114 having a negative tapered profile and generally arranged above the two adjacent conductive lines 106, as illustrated. Also as illustrated, etching must expose at least portions of the top surfaces of the two adjacent conductive lines 106. Although the specific angle of the negative tapered profile is not significant, a first lateral dimension W1 at a top of the pedestal 114 is critical to the design and function of the tapered antifuse structures described herein. Meanwhile, a second lateral dimension W2 at a bottom of the pedestal 114 will depend on, in some respect, the space or pitch of the two adjacent conductive lines 106. In all cases, the second lateral dimension W2 at the bottom of the pedestal 114 is larger than the first lateral dimension W1 at the top of the pedestal 114, as illustrated. As such, the directional etching technique is applied at a very specific angle to create the desired negative tapered profile in portions of the via level 104, as illustrated and according to known techniques.

Suitable directional etching techniques may include, but are not limited to: reactive ion etching (RIE), ion beam etching, plasma etching, or laser ablation. In an embodiment, a RIE technique using, for example, with or without including argon ion species, may be used to remove portions of the via level 104, and more specifically to remove portions of the second dielectric layer 108 and the masking layer 112. In an alternative embodiment, an ion beam etching technique using, for example, at fixed ion beam angle corresponding to the desired tapered angle of the structure, may be used to remove portions of the via level 104 and form the pedestals 114, as described above. In all cases, the directional etching technique shall be chosen and tailored to the specific material of the second dielectric layer 108 and the masking layer 112 in order to produce the desired negative tapered profile. Multiple etching techniques may be required to remove portions of the second dielectric layer 108 and the masking layer 112 individually in sequence.

Despite only a single pedestal (114) illustrated in FIG. 2, embodiments of the present invention explicitly contemplate configurations of the structure 100 which include multiple pedestals 114. In such embodiments, the pedestals 114 are located or positioned in regions intended for the tapered antifuse structures described herein. See FIGS. 9-11.

Figure 3:
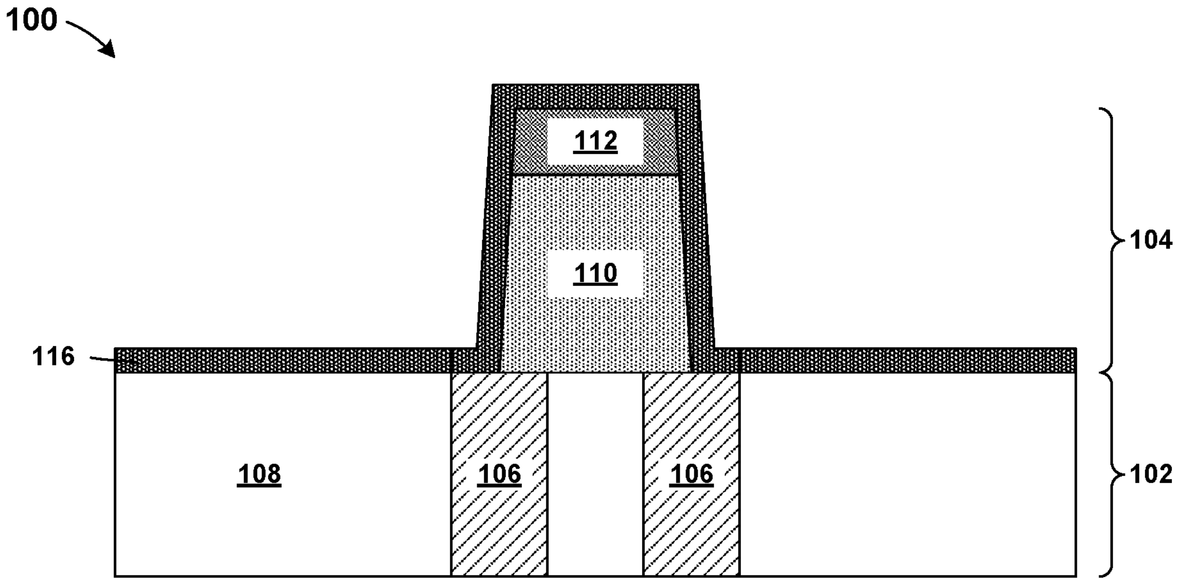
FIG. 3 illustrates a cross-sectional view of the semiconductor structure after forming a conductive layer according to an exemplary embodiment.

Referring now to FIG. 3, the structure 100 is shown after forming a conductive layer 116 in accordance with an embodiment of the present invention.

The conductive layer 116 is conformally deposited on exposed surfaces of the structure 100 according to known techniques. As used herein, "conformal" it is meant that a material layer has a continuous thickness, or substantially continuous thickness. For example, a continuous thickness generally means a first thickness as measured from a bottom surface to a topmost surface that is the same as a second thickness as measured from an inner sidewall surface to an outer sidewall surface.

According to embodiments of the present invention, the conductive layer 116 may include any suitable conductive material capable of conducting sufficient current of any typical semiconductor circuit having an antifuse structure. In an embodiment, the conductive layer 116 may include tantalum nitride, titanium nitride, ruthenium, tungsten nitride, or some combination thereof. In at least one embodiment, the conductive layer 116 may have a thickness, ranging from about 2 nm to about 30 nm. Typically, the conductive layer 116 may include a single layer; however, in other embodiments, it may include multiple layers of different conductive materials.

Since topmost surfaces of the conductive lines 106 are exposed during etching in a prior stage, the conductive layer 116 will directly contact topmost surfaces of the conductive lines 106. It is critical to the function of the tapered antifuse structures described herein.

Figure 4:
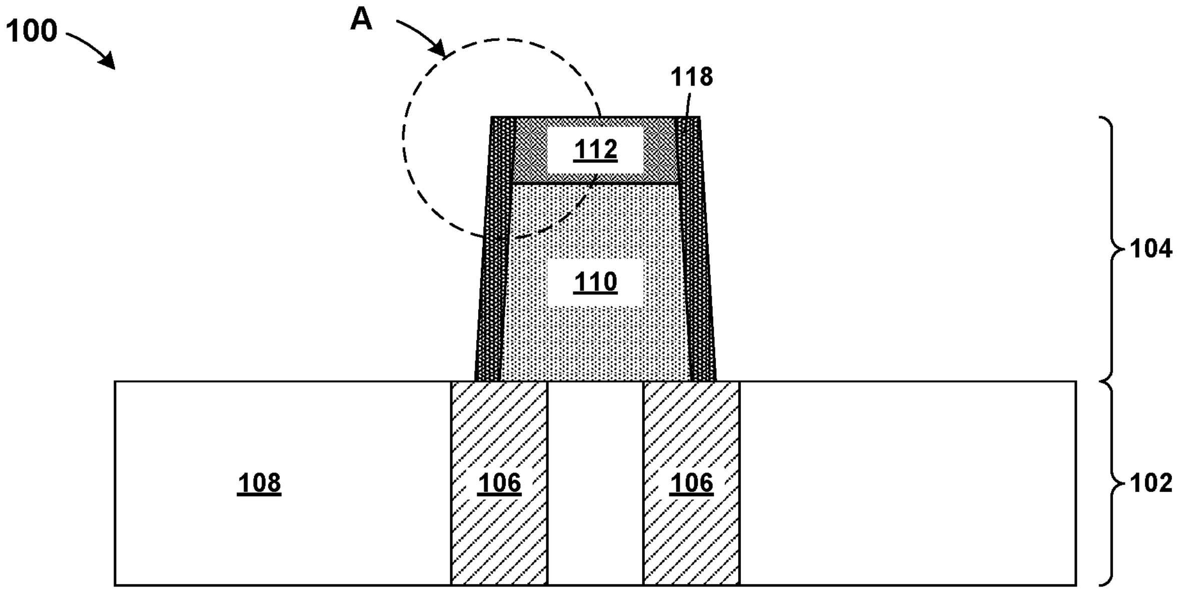
FIGS. 4 and 4*a* illustrate cross-sectional views of the semiconductor structure after removing portions of the conductive layer to create metal spacers according to an exemplary embodiment.
Figure 4A:
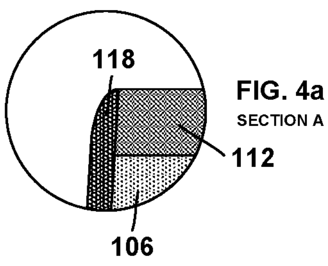

Referring now to FIGS. 4 and 4*a*, the structure 100 is shown after removing portions of the conductive layer 116 to create metal sidewall spacers 118 in accordance with an embodiment of the present invention.

An anisotropic etch is used to remove portions of the conductive layer 116 according to known techniques. Specifically, the anisotropic etch is used to remove portions of the conductive layer 116 from horizontal surfaces of the structure 100 while leaving it on the sidewalls of the pedestal 114 and thereby forming the metal sidewall spacers 118. Said differently, after etching, the metal sidewall spacers 118 remain on opposite sides of the pedestal 114. Although, the metal sidewall spacers 118 do not function as a spacer as is understood persons having ordinary skill in the art, they are referred to as such due the processing techniques used to achieve the metal sidewall spacers 118 mirror those used to create conventional dielectric sidewall spacers. According to all embodiments of the present invention, each of the metal sidewall spacers 118 may also be referred to generally as a vertical conductor, a fuse conductor, or some combination thereof. More specifically, the metal sidewall spacers 118 directly contact top surfaces of the conductive lines 106 and sidewalls of the pedestal 114, as illustrated.

In an embodiment, the metal sidewall spacers 118 will be the same conductive material as the conductive layer 116 described above. Also like the conductive layer 116 described above the metal sidewall spacers 118 may have a horizontal or lateral width, or thickness, similar to the thickness of the conductive layer 116; however, etching may reduce the final thickness by about 10% to about 50%. Further, sidewalls of the metal sidewall spacers 118 may have a slightly rounded profile as a result of etching, as illustrated in FIG. **4*a***.

Figure 5:
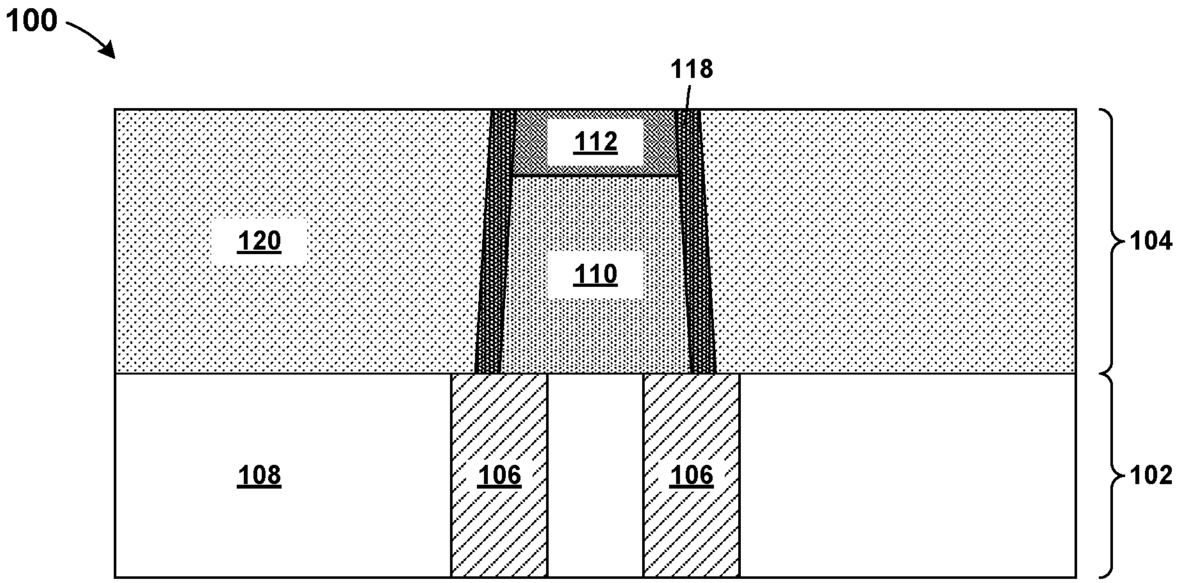
FIG. 5 illustrates a cross-sectional view of the semiconductor structure after forming a third dielectric layer according to an exemplary embodiment.

Referring now to FIG. 5, the structure 100 is shown after forming a third dielectric layer 120 in accordance with an embodiment of the present invention.

The third dielectric layer 120 is blanket deposited directly on exposed surfaces of the structure 100 according to known techniques. For purposes of the present description, the third dielectric layer 120 is the same, or substantially similar, as the second dielectric layer 110 previously described. In an alternate embodiment, the third dielectric layer 120 is a different material than the second dielectric layer 110.

After deposition, a planarization technique such as, for example, chemical mechanical planarization (CMP) and/or grinding is applied to remove excess material according to known techniques. After polishing the uppermost surfaces of the third dielectric layer 120 are flush, or substantially flush, with an uppermost surface of the masking layer 112 and the metal sidewall spacers 118. Furthermore, a height, or thickness, of the third dielectric layer 120 is approximately equal to the cumulative height of both the second dielectric layer 110 and the masking layer 112, as illustrated.

Figure 6:
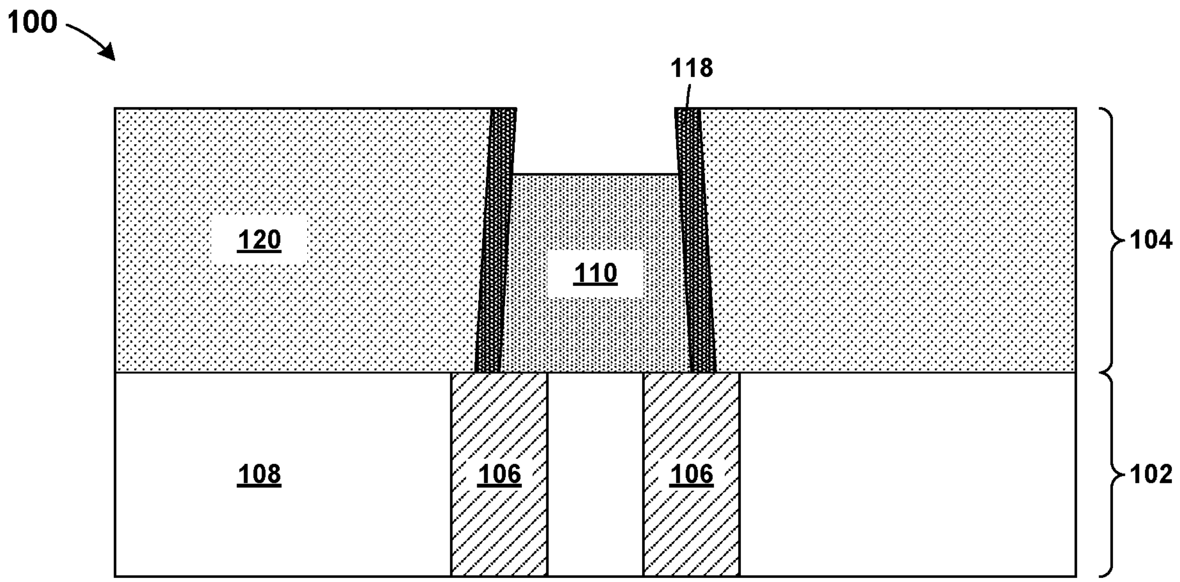
FIG. 6 illustrates a cross-sectional view of the semiconductor structure after removing the masking layer from the pedestal according to an exemplary embodiment.

Referring now to FIG. 6, the structure 100 is shown after removing the masking layer 112 from the pedestal 114 in accordance with an embodiment of the present invention.

The remaining portion of the masking layer 112 is removed selective to surrounding structures according to known techniques. Specifically, for example, in at least one embodiment, the remaining portion of the masking layer 112 is removed using a wet etching technique. Such etching techniques should be designed to remove the remaining portion of the masking layer 112 selective to the metal sidewall spacers 118 and the second dielectric layer 110, as illustrated. After the remaining portion of the masking layer 112 is removed, the pedestal 114 consisting only of the second dielectric layer 110 may be referred to as a tapered dielectric pedestal.

In embodiments having multiple remaining portions of the masking layer 112, a block mask is used to remove only certain remaining portions of the masking layer 112 in target antifuse regions. Doing so enables fabrication of multiple tapered antifuse structures with different properties See FIG. 9.

Figure 7:
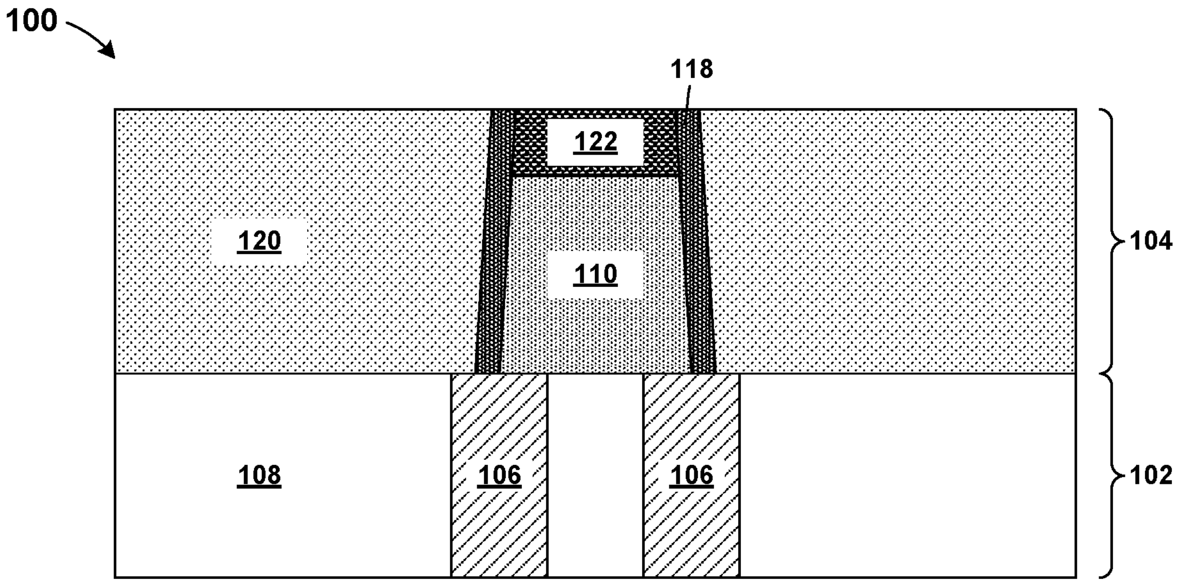
FIG. 7 illustrates a cross-sectional view of the semiconductor structure after depositing a fuse dielectric according to an exemplary embodiment.

Referring now to FIG. 7, the structure 100 is shown after depositing a fuse dielectric 122 in accordance with an embodiment of the present invention.

The fuse dielectric 122 is blanket deposited directly on exposed surfaces of the structure 100 according to known techniques. It is critical to the present invention that the fuse dielectric 122 is different than either the second dielectric layer 110, the third dielectric layer 120, or both. More specifically, the fuse dielectric 122 is a dielectric material carefully selected for its dielectric breakdown properties. For example, according to embodiments of the present invention, the fuse dielectric 122 has a dielectric breakdown voltage less than the surrounding dielectrics. Dielectric breakdown is the failure of an insulating material to prevent the flow of current under an applied electrical stress. The breakdown voltage is the voltage at which the failure occurs, and the material is no longer electrically insulating.

After deposition, a planarization technique such as, for example, chemical mechanical planarization (CMP) and/or grinding is applied to remove excess material according to known techniques. After polishing an uppermost surface of the fuse dielectric 122 is flush, or substantially flush, with uppermost surfaces of the third dielectric layer 120 and the metal sidewall spacers 118, as illustrated.

Finally, for purposes of the present description the metal sidewall spacers 118 and the fuse dielectric 122 together form an antifuse structure 124.

Figure 8:
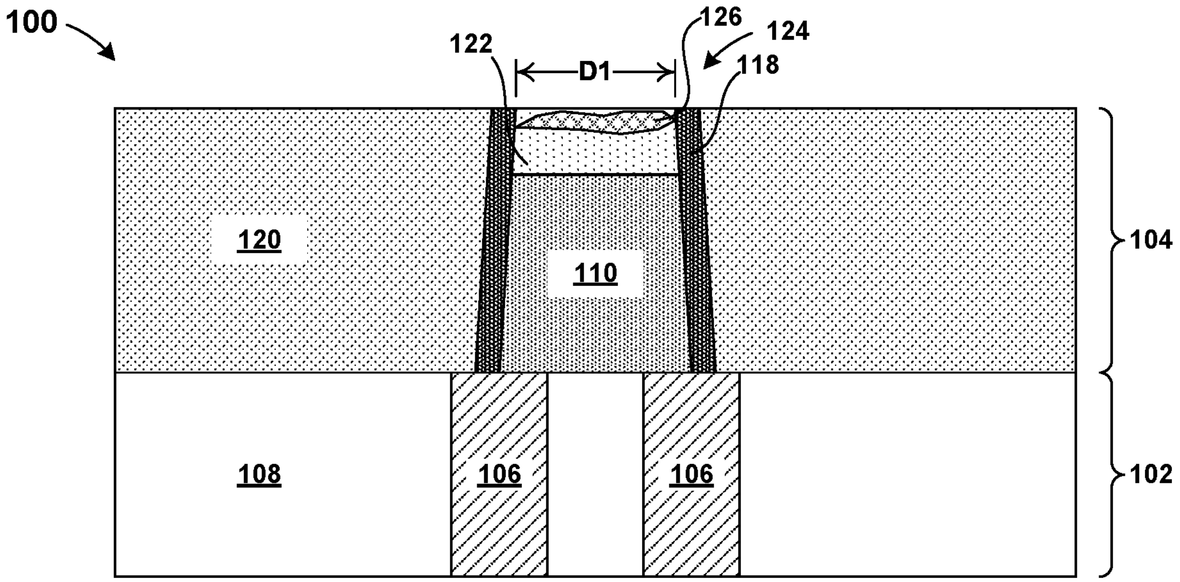
FIG. 8 illustrates a cross-sectional view of the semiconductor structure after programming the antifuse structure according to an exemplary embodiment.

Referring now to FIG. 8, the structure 100 is shown after programming the antifuse structure 124 in accordance with an embodiment of the present invention.

The relatively small distance between the metal sidewall spacers 118 and the placement of the fuse dielectric 122 together create a "weak point" prone to dielectric breakdown. More specifically, dielectric breakdown during fuse programing creates a conductive link 126 between the metal sidewall spacers 118, as illustrated. The antifuse structure 124 can be programmed by applying a programming voltage to either of the metal sidewall spacers 118 and grounding the other. In the context of the present invention, either the programming voltage or the ground may be applied to either of the metal sidewall spacers 118, and vice versa. According to the illustrated embodiment, the programming voltage and/or the ground may be applied to the metal sidewall spacers 118 via the conductive lines 106. Persons having ordinary skill in the art understand the structure 100 disclosed herein will be part of a larger integrated circuit and include additional metal layers, wiring, traces, vias which may also be involved in programming.

The programming voltage, which should be equal to or greater than the breakdown voltage of the fuse dielectric 122 may range from about 0.1 V to about 10 V, and have a current ranging from about 2 mA to about 10 mA. As a result, the fuse dielectric 122 no longer serves as an insulator, and conductive paths, for example the conductive link 126, are created within the fuse dielectric 122 between the metal sidewall spacers 118, as illustrated.

Although not critical, the conductive link 126 may have a thickness ranging from about 1 nm to about 10 nm and ranges there between. The length of the conductive link 126 is equal to a distance D1 between each of the metal sidewall spacers 118. In the present embodiments, the breakdown distance, or distance D1 between each of the metal sidewall spacers 118, is substantially equal to the first lateral dimension W1 at a top of the pedestal 114. Therefore, the dimensions of the pedestal 114 (FIG. 2) are directly proportional to the final dimension of the antifuse structure 124. Both the breakdown distance (D1) and the fuse dielectric 122 will affect how much programming current is required and how long it takes to program the antifuse structure 124 or form the conductive link 126.

With continued reference to FIG. 8, in at least one example, the breakdown distance (D1) is about equal to the spacing or pitch of the two adjacent conductive lines 106. However, programing is not solely dependent on the breakdown distance (D1) alone. As previously indicated above, programming of the antifuse structure 124 is caused by the dielectric breakdown of the fuse dielectric 122, and the dielectric material chosen for the fuse dielectric 122 is at least partly responsible for programming behavior of the antifuse structure 124. Even further, the dielectric breakdown down depends on defectivity, and the more area creates more defectivity and causes dielectric breakdown down sooner.

As illustrated in FIGS. 7 and 8, the antifuse fuse structure 124 has some distinctive and notable features. For example, the vertical antifuse fuse structure 124 has a smaller footprint than typical antifuse structures and can thus be implemented in higher density arrangements. Additionally, the fuse dielectrics can be individually tailored to achieve specific programing characteristics.

With continued reference to FIGS. 7 and 8, according to an embodiment the fuse structures represented by the structure 100 includes a first metal sidewall spacer and a second metal sidewall spacer arranged on opposite sides of a tapered dielectric pedestal, and a fuse dielectric on top of the tapered dielectric pedestal and between the first metal sidewall spacer and the second metal sidewall spacer.

With continued reference to FIGS. 7 and 8, according to an embodiment, a distance between the first metal sidewall spacer and the second metal sidewall spacer measured at the top of the tapered dielectric pedestal is smaller than a distance between the first metal sidewall spacer and the second metal sidewall spacer measured at a bottom of the tapered dielectric pedestal.

With continued reference to FIGS. 7 and 8, according to an embodiment, a vertical thickness of the fuse dielectric is less than a vertical thickness of the tapered dielectric pedestal.

With continued reference to FIGS. 7 and 8, according to an embodiment, wherein the tapered dielectric pedestal is made from an interlevel dielectric.

With continued reference to FIGS. 7 and 8, according to an embodiment, a height of the tapered dielectric pedestal is at least two times a height of the fuse dielectric.

With continued reference to FIGS. 7 and 8, according to an embodiment, tapered sidewalls of the tapered dielectric pedestal are flush with tapered sidewalls of the fuse dielectric.

With continued reference to FIGS. 7 and 8, according to an embodiment, the fuse structures represented by the structure 100 further includes a conductive link in direct contact with and extending between the first metal sidewall spacer and the second metal sidewall spacer through the fuse dielectric.

With continued reference to FIGS. 7 and 8, according to an embodiment the fuse structures represented by the structure 100 includes a first metal sidewall spacer and a second metal sidewall spacer arranged on opposite sides of a tapered pedestal, a fuse dielectric on top of the tapered pedestal and between the first metal sidewall spacer and the second metal sidewall spacer, a first conductive line below and in direct contact with the first metal sidewall spacer, and a second conductive line below and in direct contact with the second metal sidewall spacer.

With continued reference to FIGS. 7 and 8, according to an embodiment the fuse structures represented by the structure 100 includes a first pair of metal sidewall spacers arranged on opposite sides of a first tapered pedestal, a first fuse dielectric on top of the first tapered pedestal and between the first pair of metal sidewall spacers, a second pair of metal sidewall spacers arranged on opposite sides of a second tapered pedestal, and a second fuse dielectric on top of the second tapered pedestal and between the second pair of metal sidewall spacers, wherein a breakdown voltage of the first fuse dielectric is different than a breakdown voltage of the second fuse dielectric.

Figure 9:
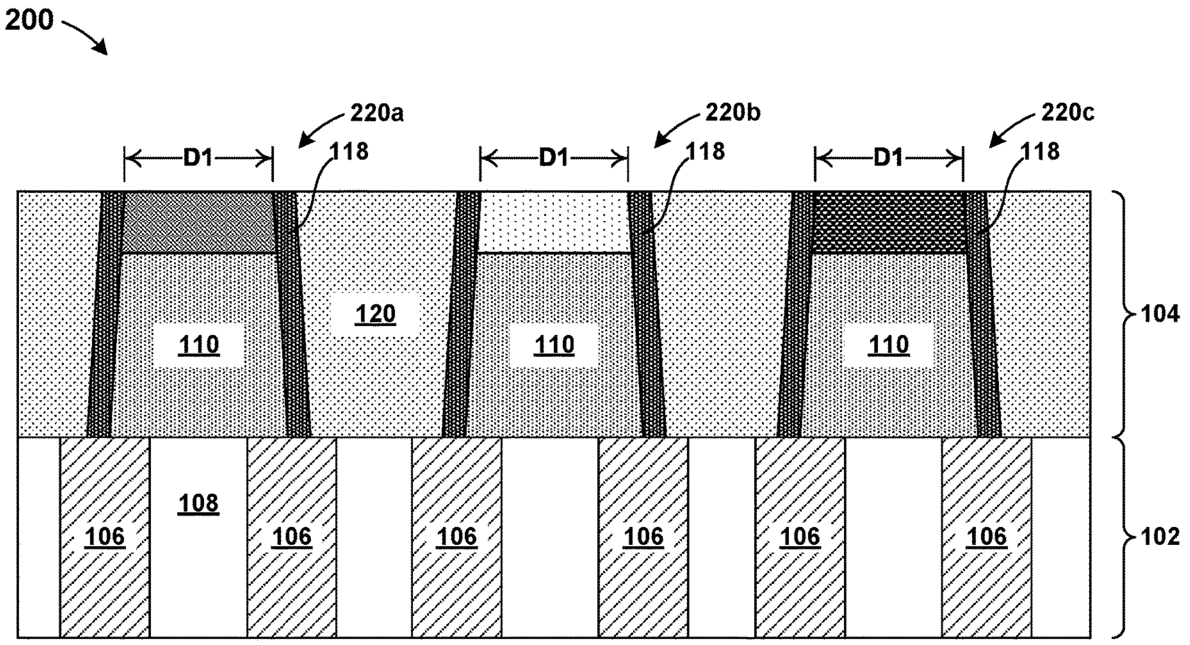
FIGS. 9, 10, and 11 illustrate views of another semiconductor structure during an intermediate step of a method of fabricating an interconnect structure according to another exemplary embodiment.
Figure 10:
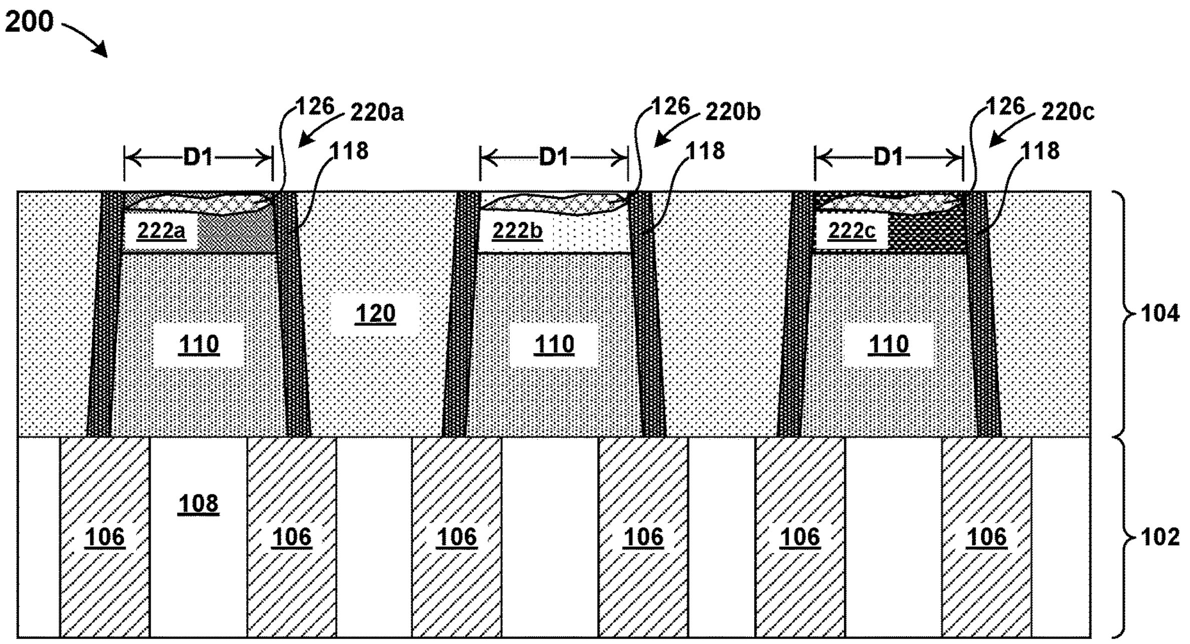
Figure 11:
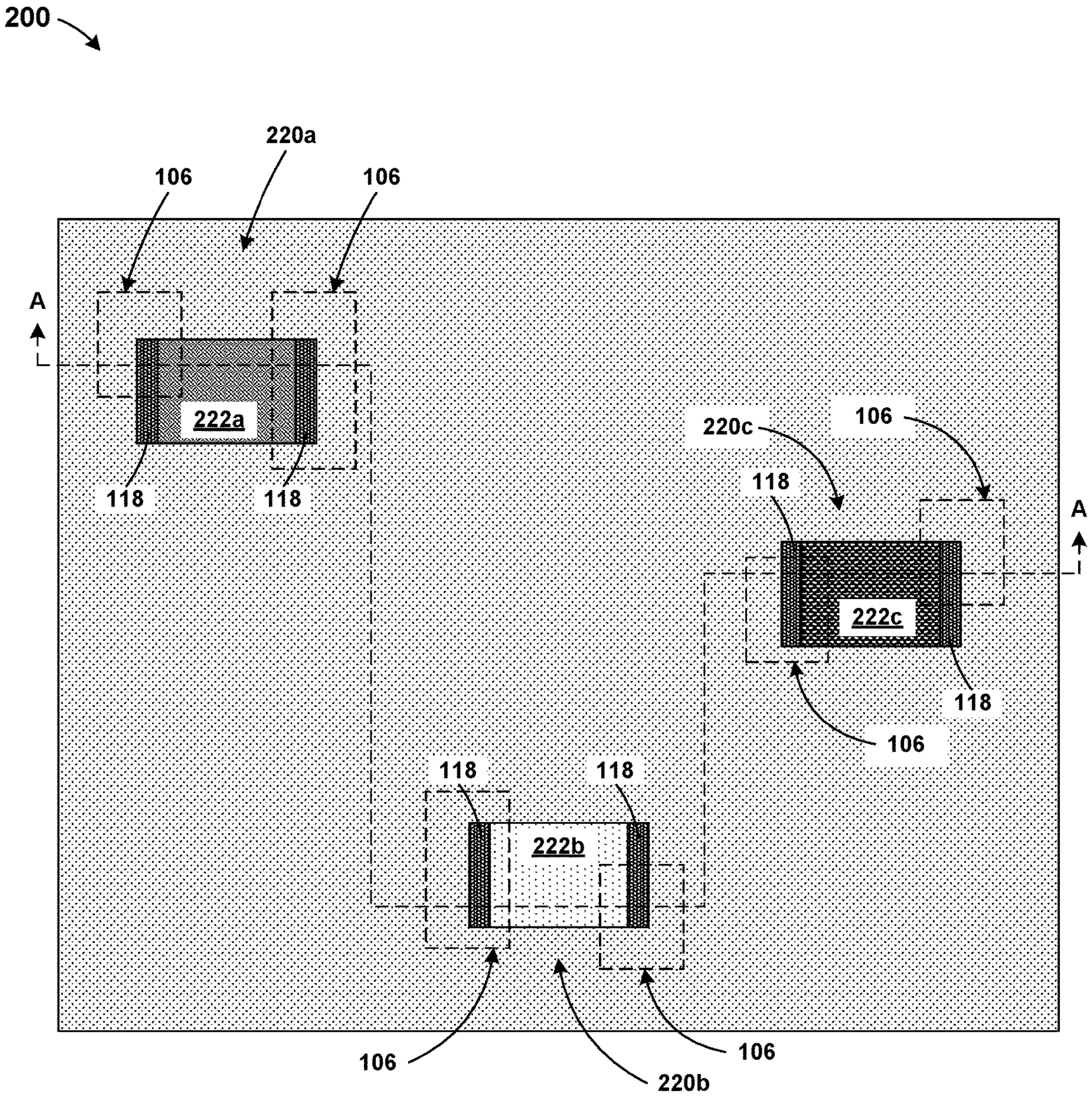

Referring now to FIGS. 9,10, and 11, a structure 200 is shown during an intermediate step of a method of fabricating an antifuse structure according to an embodiment of the invention. FIGS. 9 and 10 each depict a cross-sectional view of the structure 200 shown in FIG. 11 taken along line A-A. FIG. 11 depicts a top view of the structure 200 shown in FIGS. 9 and 10.

According to the present embodiment, the structure 200 includes multiple tapered antifuse structures 220*a*, 220*b*, 220*c* each with their own fuse dielectric 222*a*, 222*b*, 222*c*, respectively. In accordance with embodiments disclosed herein, each of the fuse dielectrics 222*a*, 222*b*, 222*c* have a different breakdown voltage. As such, each of the fuse dielectrics 222*a*, 222*b*, 222*c* are made from different dielectric materials. Otherwise, the tapered antifuse structures 220*a*, 220*b*, 220*c* have a similar design and are manufactured in a similar manner as the antifuse structure 124 described above.

Although not described above, but apparent to persons having ordinary skill in the art, manufacturing multiple tapered antifuse structures with different fuse dielectrics may require multiple additional steps. For example, in at least one embodiment, the masking layer 112 in all antifuse regions may be removed in a single etch, and then individual fuse dielectrics deposited separately at their respective regions using one or more patterning or masking material techniques. In another embodiment, the masking layer 112 is removed and replaced individually for each of the different tapered antifuse structures while a block mask is used to protect the others. In yet another embodiment, different breakdown voltage and programming characteristics may be achieved with a multi-layered fuse dielectric. For example, each fuse dielectric (222*a*, 222*b*, 222*c*) may include multiple layers of different dielectric materials to tailor or customize the breakdown voltage and programming characteristics for individual tapered antifuse structures. In all cases, and critical to the embodiments disclosed herein, multiple different tapered antifuse structures can be manufactured with individually tailored programming characteristics.

Finally, the structure 200 in FIG. 10 is shown after programming each of the multiple tapered antifuse structures 220*a*, 220*b*, 220*c*. Despite all of the tapered antifuse structures 220*a*, 220*b*, 220*c* being shown after programing and with a conductive links 126, embodiments of the present invention enable circuits with tapered antifuse structures that can be programmed with different voltages to meet the needs of a particular design or use case. More specifically, because each of the fuse dielectrics 222*a*, 222*b*, 222*c* have a different breakdown voltage they can be programmed individually. Doing so, provides increased flexibility to designers.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An antifuse structure comprising:

a first metal sidewall spacer and a second metal sidewall spacer arranged on opposite sides of a tapered dielectric pedestal; and a fuse dielectric on top of the tapered dielectric pedestal and between the first metal sidewall spacer and the second metal sidewall spacer, wherein tapered sidewalls of the tapered dielectric pedestal are flush with tapered sidewalls of the fuse dielectric.

2. The antifuse structure according to claim 1, wherein a distance between the first metal sidewall spacer and the second metal sidewall spacer measured at the top of the tapered dielectric pedestal is smaller than a distance between the first metal sidewall spacer and the second metal sidewall spacer measured at a bottom of the tapered dielectric pedestal.

3. The antifuse structure according to claim 1, wherein a vertical thickness of the fuse dielectric is less than a vertical thickness of the tapered dielectric pedestal.

4. The antifuse structure according to claim 1, wherein the tapered dielectric pedestal is made from an interlevel dielectric.

5. The antifuse structure according to claim 1, wherein a height of the tapered dielectric pedestal is at least two times a height of the fuse dielectric.

6. The antifuse structure according to claim 1, further comprising:

a conductive link in direct contact with and extending between the first metal sidewall spacer and the second metal sidewall spacer through the fuse dielectric.

7. An antifuse structure comprising:

a first metal sidewall spacer and a second metal sidewall spacer arranged on opposite sides of a tapered pedestal;

a fuse dielectric on top of the tapered pedestal and between the first metal sidewall spacer and the second metal sidewall spacer, wherein tapered sidewalls of the tapered pedestal are flush with tapered sidewalls of the fuse dielectric;

a first conductive line below and in direct contact with the first metal sidewall spacer; and a second conductive line below and in direct contact with the second metal sidewall spacer.

8. The antifuse structure according to claim 7, wherein a distance between the first metal sidewall spacer and the second metal sidewall spacer measured at a top of the tapered pedestal is smaller than a distance between the first metal sidewall spacer and the second metal sidewall spacer measured at a bottom of the tapered pedestal.

9. The antifuse structure according to claim 7, wherein vertical thickness of the fuse dielectric is less than a vertical thickness of the tapered pedestal.

10. The antifuse structure according to claim 7, wherein the tapered pedestal is made from an interlevel dielectric.

11. The antifuse structure according to claim 7, wherein a height of the tapered pedestal is at least two times a height of the fuse dielectric.

12. The antifuse structure according to claim 7, further comprising:

a conductive link in direct contact with and extending between the first metal sidewall spacer and the second metal sidewall spacer through the fuse dielectric.

13. An antifuse structure comprising:

a first pair of metal sidewall spacers arranged on opposite sides of a first tapered pedestal;

a first fuse dielectric on top of the first tapered pedestal and between the first pair of metal sidewall spacers, wherein tapered sidewalls of the first tapered pedestal are flush with tapered sidewalls of the first fuse dielectric;

a second pair of metal sidewall spacers arranged on opposite sides of a second tapered pedestal; and a second fuse dielectric on top of the second tapered pedestal and between the second pair of metal sidewall spacers, wherein tapered sidewalls of the second tapered pedestal are flush with tapered sidewalls of the second fuse dielectric, and wherein a breakdown voltage of the first fuse dielectric is different than a breakdown voltage of the second fuse dielectric.

14. The antifuse structure according to claim 13, further comprising:

a third pair of metal sidewall spacers arranged on opposite sides of a third tapered pedestal; and a third fuse dielectric on top of the third tapered pedestal and between the third pair of metal sidewall spacers, wherein a breakdown voltage of the third fuse dielectric is different than a breakdown voltage of the first fuse dielectric, a breakdown voltage of the second fuse dielectric, or both.

15. The antifuse structure according to claim 13, wherein a distance between the first pair of metal sidewall spacers measured at a top of the first tapered pedestal is smaller than a distance between the first pair of metal sidewall spacers measured at a bottom of the first tapered pedestal.

16. The antifuse structure according to claim 13, wherein a vertical thickness of the first fuse dielectric is less than a vertical thickness of the first tapered pedestal, and a vertical thickness of the second fuse dielectric is less than a vertical thickness of the second tapered pedestal.

17. The antifuse structure according to claim 13, wherein the first tapered pedestal and the second tapered pedestal are made from an interlevel dielectric material.

* * * * *